Jan. 31, 1967 F. LYMAN, JR 3,301,714

COMPLIANT THERMOELECTRIC ASSEMBLY

Filed July 30, 1963

INVENTOR:
Frank Lyman, Jr.
BY Roberts, Cushman & Grover,
ATT'YS.

United States Patent Office 3,301,714
Patented Jan. 31, 1967

3,301,714
COMPLIANT THERMOELECTRIC ASSEMBLY

Frank Lyman, Jr., Cambridge, Mass., assignor to Cambridge Thermionic Corporation, Cambridge, Mass., a corporation of Massachusetts Filed July 30, 1963, Ser. No. 298,680
4 Claims. (Cl. 136—212)

The field of utility of this invention is in the mechanical construction of thermoelectric apparatus and more particularly it relates to a technique of compliantly assembling thermoelements and thermojunction members, primarily for use in power generation but also applicable to heat pump apparatus.

The construction of thermoelectric apparatus, particularly where comparatively large temperature differences are likely to occur and rigid thermojunctions cannot easily and reliably be formed such as by soldering, the problem arises of mounting the thermocouple components such that thermal expansion and contraction does not result in plastic deformation causing mechanical defects and primarily also impairment or even interruption of the thermocouple junctions. Additional requirements must be taken into consideration, such as convenient interconnection of the thermoelectric components, optimal heat supply and extraction, and optimal heat as well as electrical transmission within the assembly.

Objects and advantages of the invention among others which appear in the context of the description of a practical embodiment thereof, are to provide a mode of electrical series connection of thermocouple elements, and thermojunction members forming thermocouple elements, which provides not only excellent electrical contacts but primarily also permanently secure mechanical interrelation of the components involved, in spite of deformations and stresses introduced by differential thermal expansion thereof as well as by exterior interference; to provide a resiliently joined and yet very compact thermocouple assembly which is not subject to detrimental stresses at the critically effective regions of the device during operation; to provide efficient heat and electrical energy transfer through a free, non-soldered thermoelectric junction assembly; and to provide such heat and electrical energy transfer and such a mechanically advantageous mode of assembly with optimally simple expedients that require a minimum of shapes to be dealt with for fabrication and on assembly. Further objects are to provide a construction of this type which is adapted for the building of thermoelectric units of any practically desirable size and for most purposes, and which is simple, rugged and very reliable and nevertheless relatively inexpensive in manufacture of the components and assembly thereof.

The nature and substance of the invention may be shortly stated as being based upon the concept of joining with compliant thermojunction members the junction faces of a group of thermoelements arranged side by side while the junction faces on the other side of the thermoelements may be joined with similar compliant members or with essentially solid jumpers. In a practically important aspect of the invention, the compliant thermojunction members also referred to as jumpers, each comprises a concave conductive trough-like member and an insert member which is concave towards the concavity of the trough member and adapted to fit therewithin such that when the opposite outer surfaces of trough and insert are pressed together, compliancy will result that is sufficient to supply the necessary yield while the contact between the compliant thermojunction member and the thermoelements against which they are pressed will not be impaired by such compliance; the construction of the compliant thermojunction member is such that their mechanical and electrical properties supplement and enhance each other. The thermoelements and junction members are pressed together and kept in assembled position by suitable plate means.

In a preferred embodiment of the invention, a compliant thermojunction member or jumper is of generally parallelopipedal configuration composed of a rectangular trough with wall members turned up along each edge of the trough bottom, and of a rectangular insert fitting into the trough, having a top sheet which is somewhat smaller than the trough area, and has turned out from the shorter ends of the sheet a pair of leg members with inturned flanges adapted to fit within the trough with the sheet protruding.

These and other objects and aspects of the nature of the invention will appear from the following description of a typical embodiment illustrating its novel characteristics.

The description of the practical embodiment refers to a drawing in which

Figure 1:
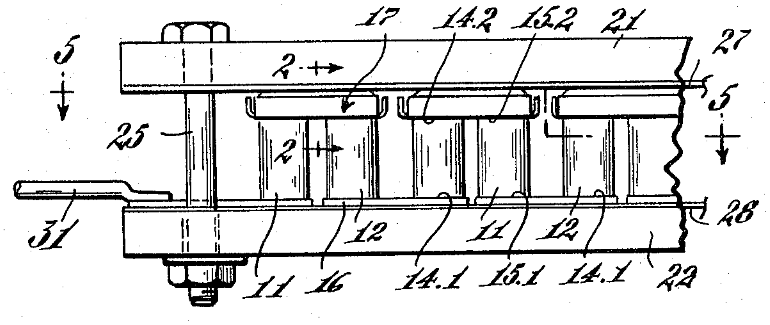
FIG. 1 is a side elevation of one end of a thermoelectric generator according to the invention.
Figure 2:
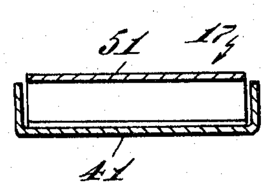
FIG. 2 is a section on line 2—2 of FIG. 1.
Figure 3:
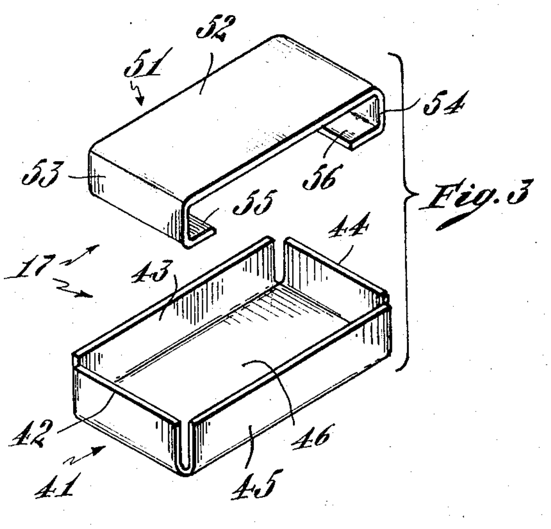
FIG. 3 is an axonometric view of a disassembled compliant junction member according to the invention.

In the embodiment according to FIGS. 1 to 3 which is preferably used for purposes of generating electric energy, but which with appropriate modification evident to those skilled in the art may also be used as a heat pump, numerals 11 and 12 designate thermoelements of conventional construction, alternately of the so-called P and N type respectively, as indicated in FIG. 1. These thermoelements are made of semiconductive material such as bismuth telluride or lead telluride. As well known, the elements of the N type have an excess of electrons in their crystal structure, whereas those of the P type have an excess of electron deficiencies or holes. The P and N elements respectively are made essentially of the same material, but with different proportions of admixtures, as well known in the art. The selection of these elements will depend upon the purpose in question; for generating electric energy, bismuth telluride is preferably used for the so-called cold range that is for a comparatively low temperature working range differential, whereas lead telluride is preferably used for the so-called hot range which as the name implies involves comparatively higher low as well as high values of the effective working temperatures at the respective junctures.

The thermoelements are joined at their junction faces such as 14.1 and 15.1 or 14.2, 15.2, by thermojunction members or jumpers, to form thermocouples. The thermojunction members or jumpers on one side, designated 16, consist preferably of short copper strips which serve to form the thermocouple junctions on one side of the thermoelements. On the other side is a second group of thermojunction members indicated at 17. These are of the peculiar compliant construction characteristic of and constituting an essential component of the present invention, to be described more in detail hereinbelow.

The thermoelements and the two respective groups of thermojunction members 16 and 17 are held in engagement by a pair of plates made for example of aluminum, and marked 21 and 22. These are firmly pressed together by suitable compression means such as for example bolts 25. The pressure plates 21 and 22 are electrically insulated from the thermoelectric assembly by means of insulators which are also good thermoconductors, such as thin Mylar films 27 and 28. As a quite satisfactory alternative, the insulation of the plates 21 and 22 from the thermojunction members 16 and 17 is provided by anodizing the inner surfaces of the pressure plates 21 and 22. Electric energy is derived from terminals such as indicated at 31, which are preferably soldered to respective thermojunction members of the first group 16, as will be described with reference to FIG. 5 herein below.

The second, compliant, group of thermojunction members or jumpers, designated 17 in the figures, is shown more in detail in FIGS. 2 and 3 as follows. Each thermojunction member of this group consists of two parts, a rectangular trough-like concave member 41 with rectangularly upwardly bent side walls 42, 43, 44, 45, and an insert member 51 with a somewhat compliant top sheet 52, two depending leg portions 53 and 54, and two inwardly directed flanges 55 and 56. The trough and insert portions are as indicated in FIG. 2, such that the leg portions 53 and 54 positively locate the insert member 51 within the trough member 41. The trough and insert members together constitute a generally speaking parallelopipedal shape which is at the same time light, strong and a good conductor. This, or analogous constructions such as described hereinbelow with reference to FIG. 4, constitute compliant as well as electrically and thermally highly effective jumpers, which provide good thermoelectric contact at the faces 14.1 and 15.1, or 14.2, 15.2 of the thermoelements, without necessitating soldering at this region. They also secure firm mechanical assembly and retention of the various components at their relative locations.

Figure 4:
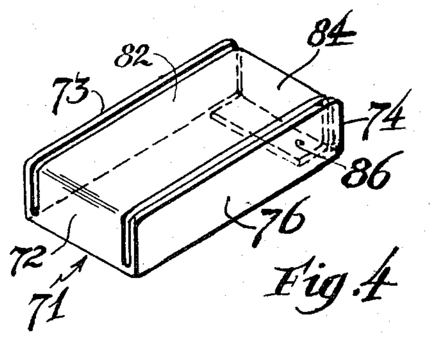
FIG. 4 is a view similar to FIG. 3 of another embodiment of the junction member.

The thermojunction members according to FIGS. 3 and 4 provide sufficient compliance to permit the necessary thermal expansion as well as to permit good pressurable contact with and between the thermoelement faces. Equally important, they provide for excellent thermoconduction between the pressure plates 21 and the thermoelectric junctions, and the heat supply or heat sink used for operating this current generating device.

As mentioned above, it will be understood that devices according to the invention can also be used as heat pumps wherein the thermojunction members 17 fulfill a similar function.

The jumper embodiment according to FIG. 4 consists of a single piece of copper with a bottom 76 and two side walls 73, 74 constituting a trough 71 and bent up and around from the bottom 46 an upright side wall 72, a top sheet 82, a depending side wall 84 and a bent in lip 86. Although the construction according to FIGS. 2 and 3 is at this time preferred because of its symmetry and more facile stamping, the one piece construction according to FIG. 4 may sometimes offer certain advantages.

As shown in FIGS. 2 to 4, the top sheets 52 (FIG. 37) and 82 (FIG. 4) protrude slightly beyond the side walls of the troughs 41 (FIG. 3) and 71 (FIG. 4).

Figure 5:
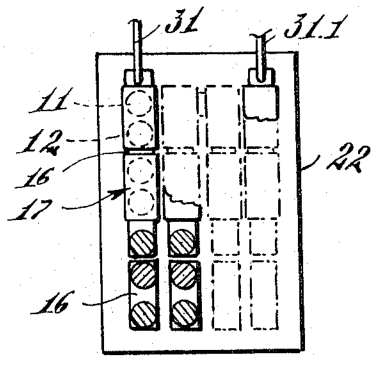
FIG. 5 is a section on line 5—5 of FIG. 1 showing a complete device and the series connection of its thermocouples.

FIG. 5 illustrates the manner in which the thermoelements and thermojunction members are assembled in electrical series connection, in known manner. In this figure, 31 is the above described termial and 31.1 the corresponding second terminal. The manner of assembly will be evident from the numerals applied to FIG. 5 which corresponds throughout to those of FIGS. 1 to 3; the junction members or jumpers are arranged in four parallel rows, with two of them on one side and one on the other side placed crosswise in order to complete the series connection. It will however be apparent that the overall mode of assembly will be modified to suit given spatial, voltage, and energy transfer requirements.

The above described construction supplies sufficient compliance to permit certain plastic deformations of the hot and cold regions of the structure as a whole, due to differential thermal expansion in transverse direction as well as in shearing senses. It was found that the structure according to the invention compensates for these stresses, does not in any way impair heat conductivity due to the abundant and firm pressurable contact between the flanges 55 and 56 and the bottom 46 of component 41 of FIGS. 2 and 3, or the corresponding components of FIG. 4. Furthermore, this construction provides excellent electrical contact for purposes of the Peltier effect at the junctions, obviating the necessity of soldering the thermoelements to form thermojunctions with members of the two groups, which is often difficult with the present day semiconductive thermoelements which are otherwise preferable to those previously used and permitting easy juncture by soldering.

As mentioned above, the means of supplying heat to or abstracting heat from the pressure plates 21, 22 or similar structures is not part of the present invention.

It should be understood that the present disclosure is for the purpose of illustration only and that this invention includes all modifications and equivalents which fall within the scope of the appended claims.

I claim:

1. Thermoelectric apparatus comprising:

a series of thermoelements arranged side by side and having junction faces in two opposite planes;

two rigid conductive plate means for confining said thermoelements therebetween;

a first group of conductive thermojunction members between the junction faces in one of said planes of said series and one of said plate means, and having an area covering two adjacent thermoelement junction faces;

a second group of thermojunction members between the junction faces in the other plane of said series and the other one of said plate means, said members of the second group having covering areas effectively similar to that of the members of said first group, and each including a concave conductive component and a conductive insert component which is concave towards the concavity of the first component, fitting therewithin with the respective backs in spaced, compliantly parallel relationship constituting contacting faces; and means for securing said series of thermoelements and said groups of thermojunction members between said plate means such as to establish compliantly continuous pressurable thermoelectric connection of selected thermoelements and junction members.

2. Apparatus according to claim 1, wherein the thermojunction members of said second group each includes an essentially concave parallelopipedal trough with a bottom and upstanding wall members along each edge and a separate insert with a top sheet and two leg members extending therefrom, each having an inturned flange, the insert fitting within the trough with the top sheet protruding.

3. Apparatus according to claim 1, wherein the thermojunction members of said second group each includes an essentially concave parallelopipedal trough with a bottom and upstanding wall members along two opposite edges, with one open side, and with the side opposite thereto extended and bent to form a top sheet and a leg extending therefrom and having an inturned flange fitting said open side and resting on the bottom of the trough, with the top sheet protruding.

4. Thermoelectric apparatus comprising:

a series of thermoelements arranged side by side with junction faces in two opposite planes;

two rigid electrically conductive plate means, for heat conductive confinement of said thermoelements therebetween, each having an electrically insulating heat conductive coating on one side thereof;

a first group of flat, conductive, essentially parallelopipedal thermojunction members between junction faces in one of said planes of said series and said coating of one of said plate means;

a second group of thermojunction members between junction faces in the other plane of said series and said coating of the other one of said plate means, said members of the second group each including a substantially rectangular trough made of conductive sheet material with a bottom and four separately upstanding sides, and a substantially rectangular insert made of conductive sheet material with a top, two upstanding legs on opposite sides of the top, and on each leg a flange extending upwardly substantially parallel to said top, said top being slightly smaller than said bottom and said legs being slightly longer than said sides of the trough and fitting within the trough with said bottom and said top constituting compliantly parallel surfaces for contacting thermoelement junction faces in said other plane and said coating of a respective plate means; and means for securing said series of thermoelements and said groups of thermojunction members between said plates such as to establish compliantly continuous pressurable thermoelectric connection of selected thermoelements and junction members.

References Cited by the Examiner

UNITED STATES PATENTS

| | | | |
|---|---|---|---|
| 3,111,813 | 11/1963 | Blumentritt | 136—4.2 |
| 3,208,877 | 9/1965 | Merry | 136—5 |

ALLEN B. CURTIS, *Primary Examiner.*